United States Patent [19]

Brockmann

[11] Patent Number: 4,868,426
[45] Date of Patent: Sep. 19, 1989

[54] PROGRAMMABLE LOGIC ARRAY HAVING CONNECTABLE MATRICES

[75] Inventor: Werner Brockmann, Altenbeken, Westdeutschl, Fed. Rep. of Germany

[73] Assignee: Nixdorf Computer AG, Fed. Rep. of Germany

[21] Appl. No.: 34,758

[22] Filed: Apr. 6, 1987

[30] Foreign Application Priority Data

Apr. 7, 1986 [DE] Fed. Rep. of Germany ....... 3611557

[51] Int. Cl.$^4$ ......................................... H03K 19/177
[52] U.S. Cl. .................................... 307/465; 307/468; 357/45
[58] Field of Search ............................... 307/465–469; 357/45; 364/716

[56] References Cited

U.S. PATENT DOCUMENTS

| | | | |
|---|---|---|---|
| 4,431,928 | 2/1984 | Skokan | 307/465 |
| 4,467,439 | 8/1984 | Rhodes | 307/465 X |
| 4,506,341 | 3/1985 | Kalter et al. | 307/465 X |
| 4,516,040 | 5/1985 | Zaplsek et al. | 307/468 |
| 4,689,654 | 8/1987 | Brockmann | 307/465 X |
| 4,703,206 | 10/1987 | Canlan | 307/466 X |

FOREIGN PATENT DOCUMENTS 0024241 2/1983 Japan .................................. 307/465

OTHER PUBLICATIONS

Askin et al., "PLA with Intermixed AND and OR Arrays", *IBM T.D.B.*, vol. 24, No. 8, Jan. 1982, pp. 4291–4292.

*Primary Examiner*—David Hudspeth
*Attorney, Agent, or Firm*—Varnum, Riddering, Schmidt & Howlett

[57] ABSTRACT

A logic array module, produced by integrated techniques for forming integrated circuits, encompasses a substrate on which are designed at least one linking field and outside of it active elements which serve for the input and output of signals and for expanding the scope of the linking field, and it is constructed of tracks (48, 56; 46, 54), arranged in the shape of columns and lines, which can be intercoupled on their crossing points (intersections) by activatable or deactivatable coupling elements (50, 58) that, depending on the status (state of connection) of a track, influence the status of a track that crosses the former so that logic linkages can be realized on the crossing track. In order to enable to form several logic linking planes within the same linking structure, the coupling elements (50, 58) of the linking field are arranged so that at least two linking matrices (44, 52) are formed with parallel lines (46; 54) and columns (48; 56) in parallel among them, where the lines (46; 54) and columns (48; 56) of the one linking matrix (44; 52) cross the columns (56; 48) and lines (54; 46) of the other linking matrix (52; 44). Furthermore, there is at least one track (46, 48; 54, 56) of a linking matrix (44; 52) connectable with at least one track (54, 56; 46, 48) of the other connecting matrix (52; 44) by means of a connecting element (62).

18 Claims, 3 Drawing Sheets

PROGRAMMABLE LOGIC ARRAY HAVING CONNECTABLE MATRICES

DESCRIPTION

1. Technical Field

The invention relates to a module produced by integrated techniques for building integrated circuits.

2. Background Art

Modules with interlinking fields or logic arrays for producing logic circuits are known in manifold forms of execution, especially with programmable coupling elements. A programming can take place with the help of masks in the production of the module or even subsequently, for example, by processing the module by means of a laser beam, but preferably electrically. The array structure of the interlinking fields offers the advantage that all imaginable boolean linkages of the input quantities among themselves, and eventually with feedback signals, can be produced in them. The programmability permits in this case the adaptation of the intergrated circuit to the actual task, since the integrated circuit is produced completely (in case of electric programming), of almost completely. This makes it possible to produce the modules costwise favorably by means of producing them in high numbers, even when a few integrated circuits are required for each task. The specification of the circuit according to the actual task is supported by software tools, starting with a logical description.

The conversion of logic functions within an array structure takes place in the structure of a combined arrangement of AND and of OR- arrays. It is preferable to make use of arrays of WIRED-AND, WIRED-OR, WIRED-NOR or WIRED-NAND linkages, preferably by insertion of bipolar transistors, field effect transistors or diodes as coupling elements in connection with PULL-UP elements or PULL-DOWN elements. Based on boolean equivalence, the AND or OR functions can be equally represented by inversions as NAND or NOR functions.

The logical behavior of the interlinking field can be established in this case by activation of the coupling elements on the crossing points of the tracks. The logic interlinkages are made then by teamwork of the coupling elements of a track that can influence the status of their circuit.

External inputs are connected in inverted and uninverted form to an AND-array, the output conduits of which are inputs of the OR-arrays. The outputs of the OR-arrays can serve as external outputs, as inputs of active elements and/or as feedbacks which are firmly introduced into the AND-array. The mentioned active elements generally are storage elements or registers, and output circuits, the output polarity of which can be programmed and that can eventually work as inputs or bidirectionally. The number of active elements is determined for each type of the integrated logic arrays. The function of the registers can be made programmable.

It is known from the German laid-open patent application No. 28 26 722 to nest into one another all AND-matrices and OR-matrices which are necessary for forming all possible logic linkages so that, in the realization of the circuit in field effect transistor technology, the gates of the field effect transistors of the AND-matrices are formed on the substrate in an upper conductor layer, while the gates of the field effect transistors of the OR-matrices are placed in a lower conductor layer and are connected at any time with the sink of the field effect transistors of the AND- matrices. The function of this interlinking field, consisting of AND- and OR-matrices, does not differ from the function of a convential linkage field in which AND- and OR-matrices are arranged spacewise one next to the other.

With the heretofore known linking fields it is hardly possible, or it is possible only in an ineffective manner, to locate multistage logic circuits within a linking field. As a rule, there are several linkage fields and eventually additional active elements necessary on the periphery of it, in order to represent multistage or composite logic structures. Maintaining the flexibility of the arrangement, i.e. the possibility of forming as many as possible different logic circuits within a linking field, can lead to a large chip surface requirement. Nevertheless, the need of a substrate surface influences to a considerable extent the costs of production of the circuit module. Besides, the design of the chip will be less regular and thus worse to test and to integrate.

SUMMARY OF THE INVENTION

It is the task of the invention to create a module of the initially mentioned type that is characterized by a very regular design of its linking structures and permits the realization of several independent logic circuits, having a tight intermeshing and forming of a multistage logic structure within the same linking structure.

This task is solved according to the invention by the features indicated in claim 1. By avoiding the feedback conduits, otherwise required for the realization of multistage logic outside the linking field, the possibility exists to create in the arrangement according to the invention, and to form within the linking field itself, variable and functionally extensive programmable structures for feeding back signals, as well as for taking over functions which are executed in conventional circuits of active elements outside the linking (logic) field. Before the final programming, a rigid fixing of the module is eliminated (for example, the determination of the number of feedbacks and registers etc.). Thus, the same modules can be utilized for different fields of application so that the modules can be produced in greater numbers at lower costs.

The expressions: connection, point of connection and connection element always refer in the following to a linkage between two or more linking matrices, while the expressions coupling place or coupling element refer to a coupling of two tracks (lands) within a linking matrix.

The coupling elements, as well as the connecting elements and the further, lower addressed interfaces are preferably programmable. That means that, at any time, one element exists which can be programmed in a known electric, optical or any other manner and which itself is brought thereby either into an activated or deactivated state, or acts activatingly or deactivatingly on the element proper executing the desired function. This latter is the case especially in coupling elements. The types of programming and their effect are widely known and do not need to be explained herein. Even in case of a personalizating of the module according to the invention by application of a suitable metalization, it is possible to use the arrangement according to the invention as a model in order to simplify the conversion of a description of a circuit in an integrated module by software tools.

New linkage possibilities are created, and/or redundances as against conventional structures are reduced in the solution according to the invention, since there is now the possibility to realize mutually independent logic circuits in so to say different logic plane. Thus, a so to say multidimensional logic linking structure with several in a functional sense logic linking planes is formed by means of the connection places between the individual separate linking matrices from a conventional, bidimensional physical linkage field.

The individual linking matrices can be nested in this case one into another so that the linear tracks (lands) of all the linking matrices are formed in a first wiring plane and the column-shaped tracks of all linking matrices in a wiring plane are located above or beneath the first wiring plane and are formed opposite this insulated second wiring plane. The individual linking matrices are then developed so that the coupling elements, assigned to a linking matrix, intercouple, for example, each second column- and line-shaped track, and enable thereby the realization of logic linkages of the above addressed type in this track matrix. The interposed tracks are coupled in the same manner. Each linking matrix can have here a conventional array design. Three and more linking matrices can be built in the same way within a linkage field so that the assignment of the coupling elements is executed, for example, to every third, fourth, etc. track.

The assignment of the tracks to the individual linking matrices must not be executed in the above described regular manner. The tracks can be assigned to the individual linking matrices in an irregular sequence so that the coupling elements are foreseen at the respective crossing points of the tracks.

The individual logic linkage planes can be of different sizes within the global physical linkage field so that the individual logic linkage planes have different numbers of lines assigned in column or line direction.

External outputs can also be selected in different ways. First, a known linking plane can serve for forming the output signals from the signals of one or several other linking planes. Secondly, active elements outside the linkage field can form output signals from several linkage fields or from a single linkage field. Furthermore, there is the possibility to foresee certain fixed points or tracks within the linkage field for controlling the outputs. The complexity of the functions to be executed will be generally raised by the application of WIRED-linkage functions.

In a realization according to the invention, not only external inputs can be connected, as in the case of conventional logic arrays, but also with some or with all linking planes, i.e. they can select in inverted and/or uninverted form coupling elements of one, or several, or of all linking planes. The influence upon all linking planes is not always sensible when, for example, one or several logic linking planes have the exclusive task of effecting complex feedbacks or couplings of other linking planes.

Just as in conventional logic-arrays, separate active elements, as for example registers, can be further connected with the linking field. In the arrangement according to the invention, these active elements can act not only upon one linking plane, i.e. upon the same linking planes with which the inputs are connected. Moreover, it is also possible to insert them sensibly for coupling purposes, while the outputs of the active elements are connected with the other linking matrices and act upon linking planes other than those with which the inputs of the active elements are connected. It is thus understandable that inputs and/or outputs of an active element are assigned only to one at a time or combined to more linking planes.

The flexibility of the arrangement according to the invention can be further increased by having free tracks inserted which are defined by that they are firmly assigned to non-external inputs, to active elements, or to external outputs and-have non coupling elements for the others, or have nly a very small number of them. On the other hand, they contain an over average number of connection elements between several linkage planes.

Due to the fact that no coupling elements or only a very few of them are available, it follows that the free tracks are not firmly assigned to any linking plane and that the cost of programming positions and consequently programming systems, as well as programming devices and tracks, is reduced, which also reduces the need for substrate surface. Therefore, these free lines are suitable for effectively realizing connections of logic linkage planes and remote points within the multidimensional linkage structure, even for functions of high complexity, without causing redundances.

With the arrangement according to the invention, there is now the possibility to realize even complex logic circuits in the tightest space by presenting certain portions of the entire logic circuit in different logic linking planes and by connecting the logic linking planes among themselves and eventually interlinking them by separate active elements. A direct access to the inner parts of the other linking planes and thereby a very tight intermeshing is made possible by having the connecting positions between the individual linking matrices. Feedbacks need not be realized anymore through their own feedback lines within or outside the linking matrix, but can ensue by means of another linkage plane of the multidimensional linkage structure. Such feedbacks can be functionally as complex as desired.

The connection between the individual linking matrices or linking planes can take place by means of inverting or not inverting connection elements, and the connection between each two and/or several linking matrices can be made at any time. The latter enables one to produce very complex linkages. The need and the kind of connecting elements depend on the functions of the linking planes to be connected.

The connections can be firmly preset or can be programmable. It is also possible to execute the connection between the individual logic linking planes either as unidirectional connections which can eventually have also a driver function, or they can be bidirectional as well. The connections can be realized by their own elements which are placed on the places of connection, as for example transmission gates, invertors, drivers, transistors, diodes, or similar elements. However, for producing connections, it is also possible to use coupling elements which, in this case, do not couple two tracks of a linking matrix, but serve instead as a connection between two or several linking matrices. This is realized by another arrangement of a connection of this coupling element. The advantage of this form of realization lies in the fact that no additional costs are required which could eventually interfere with the regular design of the linking field.

Bidirectional, firmly preset not inverting connections can be realized in the simplest way in the production of the module by omitting the insulation between both wiring planes on the intersections of the tracks. Anyhow, this connection does-not uncouple, neither can it amplify nor degenerate the signals.

The density and spacial distribution of the connection points between various linking matrices or linking planes can be selected in an appropriate manner by considering the desired flexibility of the arrangement, or a certain specification of the arrangement for certain logic circuits. In case that the tracks in the individual linking matrices can also be additionally interrupted at certain places, or even between each two crossing points individual, so to say three-dimensional blocks within the multidimensional logic linking structure can be formed. The size, number and function of these blocks can be varied with help of this programming. It is thus possible to create, for example, storage elements of any desired number and function and of any desired position within the multidimensional linking structure. The thereby created degrees of freedom enable a most effective realization of logic circuits, since no linkage exists any more to a bidimensional structure. This is valid especially when the tracks have a great number of targeted, separating points and connection points in the respective area. In this manner it is possible to produce logic array structures of new types within the very regular design of the entire physical linking field.

Each bidimensional logic linking plane, considered by itself, can have any desired structure of the above addressed type. It is also possible to design the individual bidimensional logic linking planes within the multidimensional linking structure or they can be of different structures. It is thus possible to realize at any time the AND- and the OR-array of a conventional logic array in a logic linking plane. It is equally possible to realize complete logic-array arrangements in several logic linking planes which can eventually be inserted mixed with simple AND- or OR-linking planes.

It can be also appropriate to foresee the arrangement of the coupling elements in two linking matrices so that the linking matrices, relative to their logic function, are rotated one against the other by 90° or 180°. This results in a complex functionality without interfering with the regular design and without enlarging the surface of the chip. This advantage becomes noticeable especially in the case of complex feedbacks. By means of the construction according to the invention, the planned design of logic circuits obtains thereby also an additional degree of freedom in comparison with the conventional logic arrays.

It is further possible to assign track segments to a track of different logic linking planes of the global linking field. It is thus possible to obtain a tight, functional complex intermeshing of the logic linking planes since, instead of the punctual connection, a linear connection of two or several linking planes can be executed. Here it is possible that the connecting track segment is separated from the colinearly proceeding remainder of the track. The connection is then made only by means of the obliquely proceeding tracks. On the other hand, when the track segment is no separated, a functionally widened connection results, since the direction of action can proceed also orthogonally to the direction of action of the first mentioned connection.

BRIEF DESCRIPTION OF THE DRAWINGS

Further features of the invention result from the further subclaims and from the following description which, in connection with the attached drawings, explains the invention based on examples of embodiments. The figures show:

DETAILED DESCRIPTION

Figure 1:
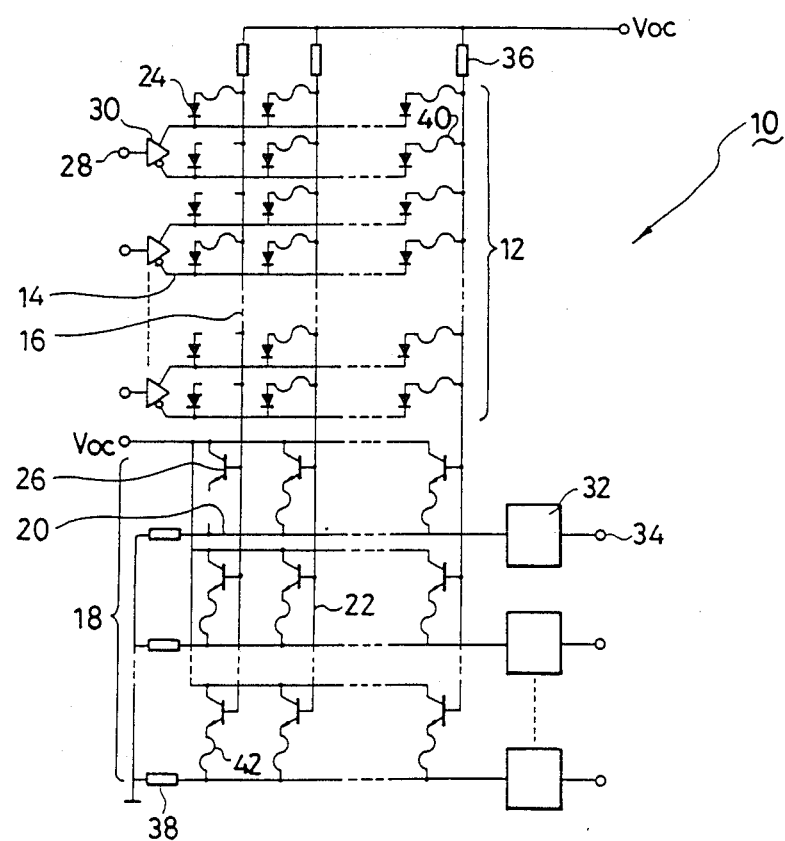
FIG. 1: a schematic illustration of a section of conventional logic arrays.

FIG. 1 shows a linking field in the form of a logic array, designated generally by 10, which enables the inversion of logical functions. The logic array 10 encompasses an AND-array 12 with linearly arranged tracks 14 and intercrossing column by column arranged tracks 16, as well as an OR-array 18 with linearly arranged tracks 20 and column by column arranged tracks 22. The intercrossing tracks 14 and 16 of the AND-array 12, and the intercrossing tracks 20 and 22 of the OR-array 18 are intercoupled by coupling elements 24 and 26, respectively, which are formed in the present example by diodes in the AND-array 14 and transistors in the OR-array 18. All coupling elements are activated in the first produced module in the present example. The module can be "personalized" for the inversion of concrete logical functions, by deactivating certain coupling elements 24 and/or 26. This is illustrated in the present example by interruption of the connection of coupling elements 24 and 26 with one of the coupled tracks.

Input signals in an inverted and not inverted form are led on the inputs 28 of the AND-arrays 12 to the tracks 14 by phase splitters 30. The output signals on the tracks 16 of the AND-array 12 form simultaneously the input signals on the tracks 22 of the OR-array 18. The output signals of the OR-array 18 are admitted in the present example of embodiment by active elements 32 to the external outputs 34. The tracks 16 of the AND-array 12 are connected with an operating voltage through resistances 36, which act as PULL-UP elements. The tracks 20 of the OR-array 18 are also connected with an operating voltage, through resistances 38 which act as PULL-DOWN elements.

As shown in the example illustrated in FIG. 1, WIRED-AND linkages are executed on the tracks 16 in the AND-array 12, and WIRED-OR linkages are executed on the tracks 20 in the OR-array 18. In this sense, these tracks execute the logic linkages proper, in connection with the activation or deactivation of the coupling elements 24 and 26 on the programming position 40 or 42, respectively.

Figure 2:
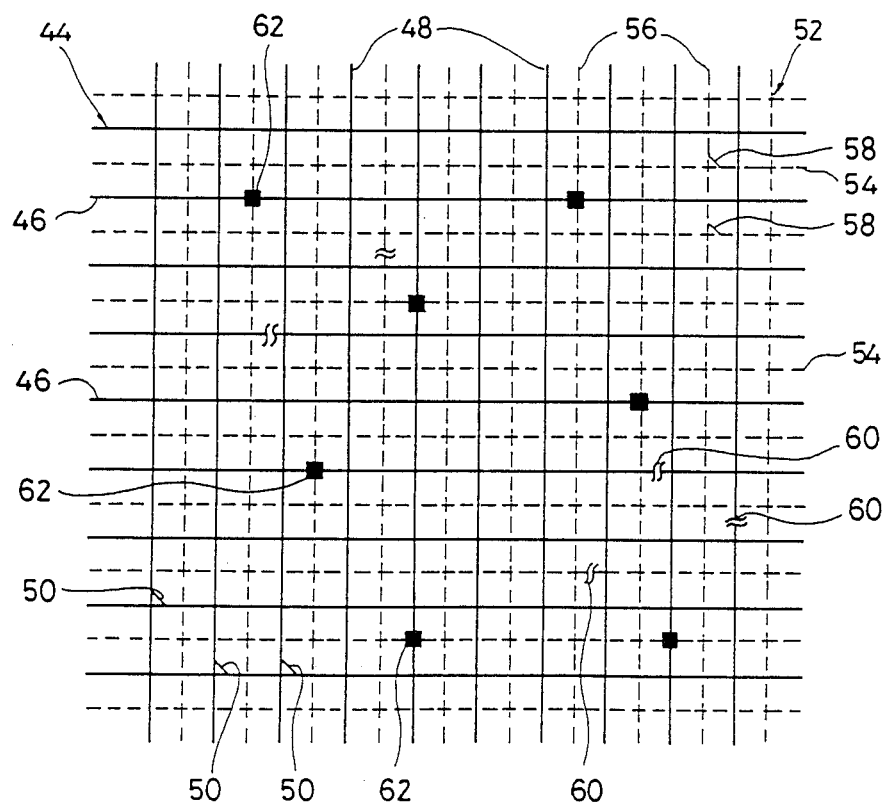
FIG. 2: a schematic top view of a linking structure according to the invention with two linking matrices.
Figure 3:
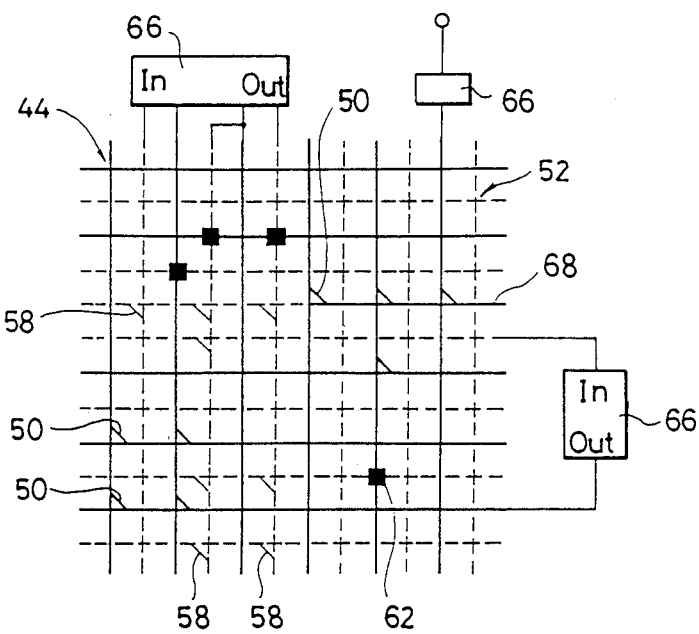
FIG. 3: a schematic illustration of two linking matrices according to the invention, which are turned one against the other by 180°.
Figure 4:
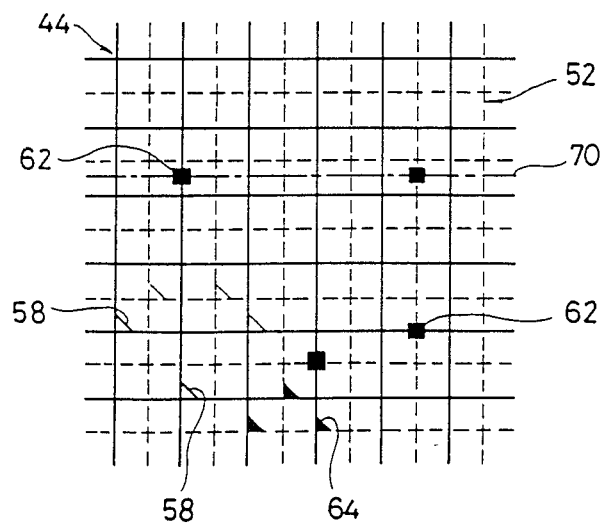
FIG. 4: a schematic illustration of two linking matrices according to the invention, and showing the use of coupling elements for connecting the linking matrices.

At any time, in FIGS. 2 to 4, identical portions are designated by identical reference numbers. The linking structure, schematically illustrated in these figures, encompasses at any time a first linking matrix 44 represented by continuously drawn lines, having tracks 46 proceeding in the direction of the row lines and tracks 48 proceeding in the direction of the columns. The tracks 46 and 48 are intercoupled by coupling elements 50 to form a desired array structure. Because of the desired design of the linking matrix 44, a concrete illustration of all coupling elements 50 between the tracks 46 and 48 was omitted. They can be formed as it has been explained according to FIG. 1.

A further linkage matrix 52, illustrated by dashed lines, is nested together with the linking matrix 44 encompassing in the direction of the lines proceeding tracks 54 and in the direction of columns proceeding tracks 56 which again lie each between two tracks 46 and 48 of the linking matrix 44 and are intercoupled by coupling elements 58. Here, as well, a new concrete presentation of all coupling elements was omitted. The coupling elements 50 and 58 of the linking matrices 44 and 52, respectively, can be designed so that the linking matrices 44 and 52 have an equal or a different array structure. Both linking matrices 44 and 52 can be provided with any desired number of interfaces 60 on which, in case that this is needed, the tracks 46, 48, 54, and 56 can be, for example, interrupted.

Both linking matrices 44 and 52 are connectable at certain crossover points 62 of their tracks 46 and 56, on the one hand, and tracks 48 and 54, on the other hand, by means of connecting elements or can be directly interconnected. The connecting positions 62 can be regularly distributed over the linking structure or certain areas of the linking structure can be predefined in which the density of the connecting positions 62 is greater in order to realize, especially in case of interrupt matrix lines, complex tightly intermeshed circuits and circuit elements.

The logic distribution according to the invention of the linking structure in two linking planes does not necessarily mean that the linking matrices 44 and 52 are actually arranged in two planes of the module's substrate, separated one from the other. By reasons of the technology of production, it is rather preferable that the tracks 46 and 54 of the linking matrices 44 and 52, respectively, proceeding in the direction of the lines, lie in a first wiring plane, and the tracks 48 and 56, proceeding in the direction of the columns, are placed in a second wiring plane that is separated from the former. By the fact that only the tracks 46 and 48 or 54 and 56, belonging at the time to a certain linking matrix 44 or 52, can be intercoupled by means of the schematically indicated coupling elements 50 or 58, respectivley two from each other separated linking matrices are formed which are connected or can be electrically connected to the connecting position 62. The connection between the linking matrices can be realized in this case in different manners, as it has already been above described. It is indicated on the connecting position 64, in FIG. 4, that coupling elements were used here which are usually assigned to one of the two linking matrices 44 or 52, for connecting the two linking matrices 44 and 52.

It is easy to recognize that this arrangement can be extended at any time to several linking planes by more than one intermediate line. In principle, the number of linking planes is not limited. However, it would not be suitable to nest too many linking planes one into another, since in case of many logic linking planes, even with a still warrantable chip surface and processing speed, relatively few circuit logics can be realized within the actual planes.

Active elements can be arranged in the way indicated in FIG. 3 on the edge of the linking field and connected with one or with several linking matrices in different manners, as this has been already explained here above. In the example illustrated in FIG. 3, both linking matrices 44 and 52 are interconnected by the active elements 66. Otherwise, the detailed entry of separate registers and external inputs and outputs were deliberately omitted, since their connection to arrays is known by itself.

Furthermore, FIG. 3 shows the case in which the linking matrices 44 and 52 are turned one against the other by 180° which is indicated by the respective arrangement of the coupling elements 58. By this change of the effect of the operation during the transition from one logic linking plane to the other, complex functions and feedbacks can be illustrated in the simplest manner.

Furthermore, a track in FIG. 3 is designated by 68, having its left dashed half side assigned to the linking matrix 52 and its right half side of the linking matrix 44 illustrated in full continuous lines. By using single segments of a track for various linking matrices, it is possible to obtain an especially space saving design of logic circuits. In this case, the segments of the track can be separated one from the other or also interconnected, in order to establish a connection of the linking matrices so that the connection may be preferably produced to be programmable.

FIG. 4 illustrates by a dash-dotted line 70 a free line that is already from the outset not firmly assigned to one of both linking matrices 44 and 52 or connected by external inputs, outputs and active elements. Such a free line increases the flexibility in the design of logic circuits. In the present example of embodiment, it is indicated in FIG. 4 that in the free track 70, the points of both linking matrices 44 and 52, placed spacewise remotely one from the other, can be directly interconnected.

The free line 70 also includes a few coupling elements which, controlled by it, influence the state of the circuitry of other tracks 46, 48, 54, 56. The functionality of the circuitry of other tracks, especially in case of a not uninterrupted rectilinear course, will be strongly expanded.

In addition to the above-described advantages, the linking structure according to the invention provides further the possibility of realizing within an array structure not only new circuit functions but, for example, assigning also diverse functions to the various linking planes. For example, a plane can take over the function of active elements and do it namely eventually in addition to the active elements 66 (FIG. 3), placed on the edge of the linking field. The function and the number of these active elements is programmable within the linking plane. These elements additionally have direct access to other linking planes and work therefore more effectively. This signifies an additional degree of freedom in comparison to conventional array structures.

Advantageous applications of the linkage structure according to the invention are conceivable also for the area of data processing so that, for example, individual linkage planes are specially made for processing bus signals and for exercising control functions.

A further possibility for advantageous application of the linking structure according to the invention consists, for example, in that the function of a logic linking plane can be monitored by a further logic linking plane. When errors occur, it is possible to charge a further linking plane with the execution of functions of the defective linking plane by this functionally superimposed linking plane.

As an example of a further way of using the advantages of the design according to the invention, the PLA (programmable logic array) adder, according to Weinberger, is to be used (see A. Weinberger, "High Speed Programmable Logic Array Adders", IBM Journal of Research and Development, Vol. 23, No. 2, March 1979). In these PLA adders, four inputs are mutually decoded on special decoders linked in a linking field and then combined by EXCLUSIVE-OR gates. Since this design is cut especially for adding purposes, it cannot be realized with the help of a conventional logic array module. On the other hand, it is made possible with a module according to the invention. For this purpose, the inputs in the first linking plane are decoded, linked in a second plane, and the linking results are combined in a third plane that performs the EXCLUSIVE-OR functions and are led to the outputs. It is also possible to transfer in the same manner the extension of the principle to arithmetic logic units (see M. S. Schmogler "Design of Large ALUs Using Multiple PLA-macros", IBM Journal of Research and Development, vol. 24, No. 1, January 1980). According to these examples, it can be seen that the design of a logic array module according to the invention enables one to realize new applications and differs by this advantageously from the conventional logic arrays.

The embodiments of the invention in which an exclusive property or privilege is claimed are defined as follows:

1. In a logic array module formed by integrated technology for producing integrated circuits with a substrate on which at least one linking field and active elements (66) at the outside of the linking field are formed, with the active elements (66) designated for the input and output of signals and for expanding the scope of functions of the linking field, and with said at least one linking field formed of tracks (48, 46; 56, 54) arranged in rows and columns that can be coupled n their crossover points by activatable or deactivatable coupling elements (50; 58), which, depending on the logic circuit status of a first one of the tracks, influences the logic circuit status of a second track that crosses the first track so that on the crossing second track it is possible to realize logic functions, characterized in that the coupling elements (50, 58) of the linking field are arranged so that at least two liking matrices (44, 52) with mutually parallel rows (46; 54) and columns (48; 56) are formed, wherein the rows (46; 54) and columns (48; 56) of one of the linking matrices (44; 52) respectively cross the columns and rows of another of the linking matrices (52; 44), and that at least one track (46, 48; 54, 56) of the one linking matrix (44; 52) is connectable with at least one track (54, 56; 46, 48) of the another linking matrix (52; 44) by means of a connecting element (62).

2. A module according to claim 1, characterized in that the linking matrices (44, 52) are nested one into the other so that row tracks (46, 54) of all linking matrices (44, 52) are placed in a first wiring plane and column tracks (48, 56) of all linking matrices (44, 52) are placed in a second wiring plane that is insulated from the first wiring plane 3. A module according to claim 1, characterized in that at least one linking matrix (44, 52) has an array structure that differs from the other linking matrices.

4. A module according to claim 1, characterized in that the coupling elements (50, 58) are arranged within two linking matrices (44, 52) so that the linking matrices (44, 52) are oppositely oriented relative to their logic function.

5. A module according to claim 1, characterized in that the linking matrices (44, 52) are not coextensive.

6. A module according to claim 1, characterized in that at least one linking matrix (44, 52) has a complete logic-array design with a partial matrix performing an AND-function and an OR-function.

7. A module according to claim 1, characterized in that at least one connecting element (62) is designed so that it interconnects tracks (46, 48; 54, 56) of two or several linking matrices (44, 52).

8. A module according to claim 1, characterized in that at least respective ones of the linking matrices (44, 52) include different segments of a single track (68), where the track segments may be programmably interconnected.

9. A module according to claim 1, characterized in that at least one connecting element (64) is formed by a coupling element of one of the linking matrices (44, 52).

10. A module according to claim 1, characterized in that at least one connection position for a connecting element (62) has between the linking matrices (44, 52) a programmable bidirectional connecting element that can be selectively enable, or a programmable unidirectional connecting element that is selectively reversible in its direction of connection.

11. A module according to claim 1, characterized in that the connecting element is designed as a signal regenerating connecting element.

12. A module according to claim 1, characterized in that one or more inputs and/or outputs of at least one active element are connected with tracks of several linking matrices (44, 52).

13. A module according to claim 1, characterized in that all outputs of the linking field are connected to a single linking matrix.

14. A module according to claim 1, characterized in that the linking field encompasses at least one free track (70) which is not assigned to an external input nor to an active element nor to an external output, and which is connected to at least two other tracks (48, 56) by means of connecting elements (62).

15. A module according to claim 14, characterized in that one of said at least one free track (70) is coupled with a very small number of coupling elements, in comparison to the other tracks so that the coupling elements, controlled by the free track (70), are connectable to the crossing tracks (48, 56).

16. A module according to claim 1, characterized in that at least one track (46, 48; 54, 56) of at least one linking matrix (44, 52) has an interface (60) between segments of the at least one track that can be brought programmably from a connecting into an interrupting or from an interrupting into a connecting status.

17. A module according to claim 16, characterized in that the module comprises a plurality of the interfaces (60), and the number of interfaces per unit area is inhomogeneous in the linking field.

18. A module according to claim 16, characterized in that the number of connecting positions (62) per unit area is inhomogeneous in the linking field.

* * * * *